US006457978B1

(12) United States Patent
Cloonan et al.

(10) Patent No.: US 6,457,978 B1
(45) Date of Patent: Oct. 1, 2002

(54) METHOD AND APPARATUS FOR ARRANGING CABLE CONNECTORS TO ALLOW FOR EASIER CABLE INSTALLATION

(75) Inventors: Thomas J. Cloonan, Lisle, IL (US); Daniel W. Hickey, Oswego, IL (US); Thomas J. Mack, Palatine, IL (US); David R. Johnson, Naperville, IL (US)

(73) Assignee: Cadent, Inc., Lisle, IL (US)

( * ) Notice: Subject to any disclaimer, the term of this patent is extended or adjusted under 35 U.S.C. 154(b) by 0 days.

(21) Appl. No.: 09/883,716

(22) Filed: Jun. 18, 2001

Related U.S. Application Data

(63) Continuation-in-part of application No. 09/685,354, filed on Oct. 10, 2000.

(51) Int. Cl.[7] .......................... H01R 12/00; H01R 12/16; H05K 1/00
(52) U.S. Cl. ............................. 439/61; 439/62; 361/788
(58) Field of Search ................. 439/446, 578, 439/604, 98, 296, 108, 607, 61, 62; 361/788

(56) References Cited

U.S. PATENT DOCUMENTS

| | | | | |
|---|---|---|---|---|
| 5,430,615 A | * | 7/1995 | Keeth et al. | 361/784 |
| 5,726,788 A | * | 3/1998 | Fee et al. | 359/118 |
| 6,241,530 B1 | * | 6/2001 | Eddy et al. | 439/61 |

* cited by examiner

*Primary Examiner*—Khiem Nguyen
*Assistant Examiner*—Chandrika Prasad
(74) *Attorney, Agent, or Firm*—Vedder Price Kaufman & Kammholz

(57) ABSTRACT

A cable modem termination system (CMTS) having front and rear sides is disclosed. A rear panel receives a plurality of connector cards. At least one first connector card wherein each first connector card has a row of connectors. At least one second connector cards, wherein each second connector card has a row of connectors, wherein connectors on the first connector cards are staggered from connectors on the second connector cards when the connector cards are inserted into the rear panel.

7 Claims, 4 Drawing Sheets

-PRIOR ART-

METHOD AND APPARATUS FOR ARRANGING CABLE CONNECTORS TO ALLOW FOR EASIER CABLE INSTALLATION

CROSS REFERENCE TO RELATED APPLICATION

This is a continuation-in-part of U.S. patent application Ser. No. 09/685,354, entitled METHOD AND APPARATUS FOR ARRANGING CABLE CONNECTORS TO ALLOW FOR EASIER CABLE INSTALLATION, filed on Oct. 10, 2000 by Cloonan, which the prior application is assigned to Cadant, Inc., the same assignee as in the present application.

FIELD OF THE INVENTION

The present invention relates to a method and apparatus for arranging cable connectors to allow for easier cable installation.

BACKGROUND OF THE INVENTION

The world is on the verge of a revolution that promises to change the way the Internet works and it is guaranteed to change the way the entire world communicates, works and plays. The revolution is the introduction of quality of service (QoS) to the Internet. This QoS revolution is already beginning, because most computer networking products (switches and routers) have already added some type of QoS to their feature sets. Unfortunately, there are many different forms of QoS from which to choose and they are not all compatible with one another. Different standards committees (DiffServ, RSVP, MPLS, etc.) are still deciding which of many different QoS proposals will actually be used in the Internet, and hybrid solutions will likely be developed in the very near future that will enable the QoS revolution.

The change is important, because it will eliminate the current Internet routing model that provides the same "best effort" service to all users, all packets, and all traffic flows. When QoS is enabled in a ubiquitous, end to end fashion across the Internet, differentiated services will be permitted, and all packets will be treated differently. High priority packets will be routed with lower latency and lower jitter, while low priority packets may experience more delay and jitter. The throughput needs of each application will determine the priority associated with its corresponding traffic flows, and it is likely that advanced application programs of the future will dynamically change the priority of traffic flows to match the very needs of the user through the entire duration of the session.

Since all packets will not be passed using the same priority level, it follows that all packets cannot be billed using the same charges in the future either. Future Internet users are likely to pay differently for different classes of service, and they may even be billed on a usage basis, e.g., per-minute, per packet, or per byte, similar to the billing schemes used for long distance telephone service today. The use of high priority traffic flow for an application will undoubtedly result in higher Internet usage costs than the use of low priority traffic flows and service level agreements (SLAs) between the Internet user and their service provider will detail the available priority and throughputs in and their associated costs. These changes in the Internet billing model represent an incredible revenue generating potential for access providers that can provide and bill for these new differentiated services, and multiple system operators (MSOs) are key members of this group.

MSOs are positioned in an ideal location within the Internet to play a major role in the QoS revolution, and they will be able to capitalize on the resulting changes. This is because the MSOs are positioned to act as the QoS gatekeeper into the future Internet. They can perform this function because they have access to each subscriber's service level contract and can appropriately mark the priority of all packets that are injected into the Internet by their subscribers. In fact, the MSOs head end equipment, the cable modem termination system CMTS is actually the first piece of trusted equipment not owned by the subscriber to which subscriber packets must pass on their way to the Internet. The CMTS is positioned at the head end office and it provides basic connectivity between the cable plant and the Internet. FIG. 1 illustrates a simplified cable data system with a CMTS 30. The CMTS 30 is connected through Internet link 40 to the Internet 20. The CMTS 30 is also connected through various cable links 50 to a plurality of subscribers 60.

The MSO also provides customer subscription packages and is able to offer (and bill for) many different subscriber service levels. In addition, if the CMTS equipment permits it, the MSO will also be able to offer dynamic service level upgrades to its subscribers. Features contained within an MSOs CMTS must provide most of these revenue generating QoS capabilities. This will result in even greater increases in revenues if the MSOs can maintain adequate counts on usage of different services levels consumed by its subscribers.

As set forth above, this CMTS provides basic connectivity between the cable plant and the local area network that interfaces to an edge router on the Internet. The CMTS is responsible for appropriately classifying, prioritizing, flow controlling, queuing, scheduling and shaping all the traffic flows between cable data subscribers and the Internet. As a result, this type of service experienced by the cable data subscribers will primarily be determined by the features in the CMTS core.

When selecting a CMTS for cable data deployment or expansion, MSOs have several different options from which to choose. The choice is complicated by a broad spectrum of prices and features such as reliability levels, ease of use, controllability, manageability, observability, support for various interfaces, support for various counts and measurements, support for proprietary features and feature upgrades, vendor service levels, etc. The CMTS selection process is even further complicated by the fact that a particular set of CMTS features that are required in one head end area may actually be undesirable in a different head end area because subscriber usage patterns and traffic profiles within the one region may be entirely different from those in another region.

Nevertheless, there is one CMTS feature that will undoubtedly be desirable and necessary for most of the head end that almost all of the MSOs as cable data service expands into the future. This feature is scalability. When referring to the size of a CMTS, the term scalable can be assigned two different meanings. According to one definition, a scalable CMTS should allow growth along a graduated path from very small sizes to very large sizes without imparting any large costs increments onto the MSO at any step along the graduated growth path. According to a second definition, a scalable CMTS should be capable of reaching the maximum capacity for size permitted by the underlined CMTS technology. For many reasons, MSOs might want to look for both of these scalability features when making their CMTS purchasing decisions.

The first of these features (graduated growth) is desirable in a CMTS because cable data services almost always greeted with incredible popularity when ever it enters a new subscription area. This typically leads to the dramatic increase in subscribers within a very short interval of time. To accommodate the sporadic usage increases, the CMTS must be able to rapidly increase the number of downstream and upstream channels being delivered to the subscribers. Any delay in this channel increase may force an MSO to temporarily over subscribe the existing cable data channels. The densely packed subscribers on the over subscribed channels are likely to complain and/or lose interest in the service giving the competitors with cable data service a chance to steal subscribers.

Even an established cable data service area where the upstream and downstream channel counts have been nicely matched to the current subscriber base, the subscriber demand for bandwidth will continually increase over time as new bandwidth hungry Internet applications are introduced. This increase in bandwidth demand will manifest itself as an increase in the subscription rate for higher service level agreements and that will force the MSOs to pack fewer subscribers on a given channel, and that will again require the CMTS to be able to rapidly increase the number of channels even if it is providing to the same number of customers. This illustrates a second reason why graduated growth is a desirable feature in a MSOs CMTS.

The second definition of scalability (maximum capacity) is also a desirable feature within a CMTS, because the ultimate subscriber rates for cable data service are likely to approach the 20–25% levels within these established service areas. Thus, a typical head end supporting 60,000 cable TV subscribers may need to support up to 15,000 cable data subscribers. If future bandwidth demands limit the MSOs to only 500 cable data subscribers per downstream channel, then the maximum equipped CMTS should be capable of supporting up to 30 downstream channels. In addition, if the typical head end requires 4 upstream channels to be associated with each downstream channel, then the maximally equipped CMTS should be capable of supporting up to 120 upstream channels. Unfortunately, accommodating all of these (30+120)=150 connections out of the CMTS will require a large amount of cabling. Each of the 150 required connections must be transported on a coaxial cable. In a well designed system with high availability, the system repair time should be kept to a minimum, so the bundle of cables emanating from the CMTS will likely be coming from the backside of the system chassis to allow office technicians to rapidly replace faulty circuit cards by pulling them off the front side of the system chassis without having to remove and restore the cabling that emanates from the backside of the chassis.

Another feature that will undoubtedly be required at most feature at CMTS products is flexibility. In particular, CMTS' must be able to accommodate the many different traffic profiles throughout the usage area. This implies that the equipment of the CMTS chassis will be different with each head end office because the equipment must be customized to match the input demands of the customers connected to each head end.

As an example, in some areas, this may require circuit cards that require one upstream channel for each downstream channel also known as 1D:1U circuit cards. In other areas, this may require circuit cards support for upstream channels for each downstream channel which is also known as a 1D:4U circuit card. In still other areas, this may require circuit cards that support each upstream channels with each downstream channel also known as a 1D:8U circuit card. Many other types of useful circuit cards can also be envisioned including, but not limited to, 1D:3U circuit cards, 2D:8U circuit cards, 2D:4U circuit cards, and 2D:2U circuit cards. In general, any type of circuit cards of type nD:nU can be envisioned wherein m and n are non-negative integers.

To make matters even worse, the CMTS chassis within a single head end office is likely to require several different types of front circuit cards to accommodate different traffic profiles on different cables leaving the head end office. Thus, a single CMTS might need to be equipped with b 1D:1U circuit cards, c 1D:4U circuit cards, d 1D:8U circuit cards, e 1D:3U circuit cards, f2D:8U circuit cards, g 2D:4U circuit cards, h 4D:4U circuit cards and i MD:NU circuit cards where b, c d, e, f, g, h, i, m and n are non-negative integers.

Given that backside cabling is likely to become more popular over time, as high availability CMTS' become more popular, it is apparent that a fundamental problem will develop. The problem is centered around the difficulties that will be encountered by the cable office technicians that are responsible for correctly installing and maintaining the many cables that must be connected to the backside of the high capacity next generations CMTS chassis. Correct connection for the many cables to the backside of the chassis is itself a difficult task.

As described above, there can be, for example, 150 connectors on the back side of the CMTS chassis. FIG. 2 illustrates a connector pattern on the back side of a known CMTS chassis. In this example, the connectors are situated on four cards 204, 206, 208 and 210. The first connectors (212, 214, 216, 218) on each of the cards are situated in a straight line. Likewise, the second connectors on each card are situated in a straight line. This pattern remains uniform throughout the four cards. When cables have been connected to some or most of the connectors, it becomes difficult to connect new cables to the remaining connectors simply because there is very little room between the connectors. Likewise, it can be very difficult to disconnect a cable from a connector when the surrounding connectors are attached to cables. For example, when a technician wants to connect a cable to connector 220 and cables are already connected to connectors 214, 216, 218, 222, 224, 226, 228 and 230, the technician may have a hard time connecting the cable to connector 220 for the lack of space for maneuvering his hand in the space around the connector 220.

SUMMARY OF THE INVENTION

The invention alleviates some of the problems caused by the high density of connectors on the back of the CMTS chassis by staggering the position of connectors on adjacent cards so as to optimize the amount of space between each connector.

According to one embodiment of the present invention, a cable modern termination system (CMTS) having front and rear sides is disclosed. A rear panel receives a plurality of connector cards. At least one first connector card wherein each first connector card has a row of connectors. At least one second connector cards, wherein each second connector card has a row of connectors, wherein connectors on the first connector cards are staggered from connectors on the second connector cards when the connector cards are inserted into the rear panel.

According to another embodiment of the invention, a method for arranging cable connectors on a panel of a cable modem termination system (CMTS) to allow for easier cable manipulation is disclosed. The position of connectors on a first connector card type are staggered with respect to position of connectors on a second connector card type. First and second connector card types are alternately inserted into the panel so as to optimize the separation between connectors on adjacent cards.

BRIEF DESCRIPTION OF THE DRAWINGS

The teachings of the invention can be readily understood by considering the following detailed description with conjunction with accompanied drawings, in which.

DETAILED DESCRIPTION

Figure 3:
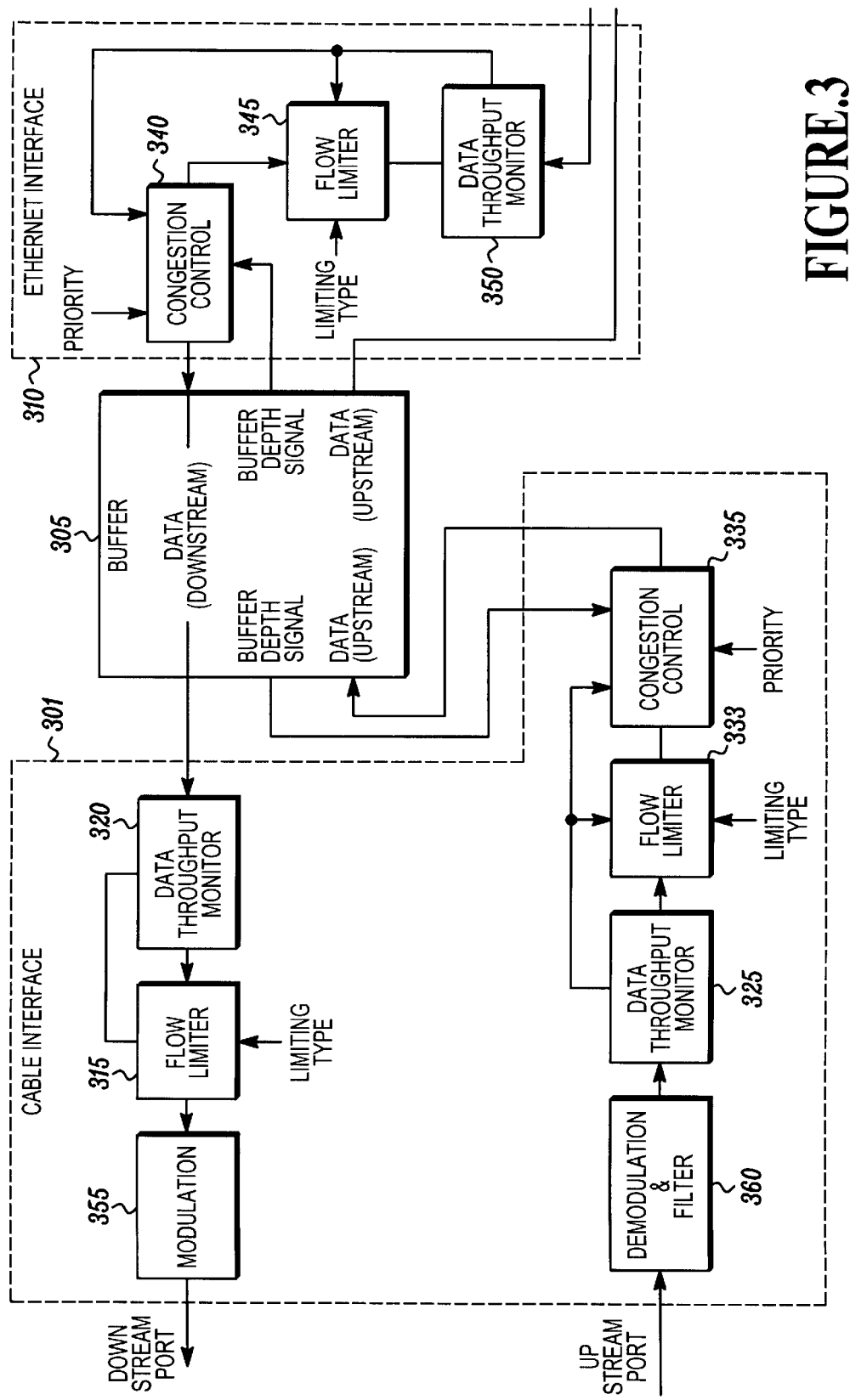
FIG. 3 illustrates a CMTS according to one embodiment of the invention.

FIG. 3 illustrates a cable modem termination system (CMTS) apparatus according to one embodiment of the invention. The CMTS apparatus of FIG. 3 is comprised of a cable interface (301) that is coupled to a buffer circuit (305). The buffer circuit (305) is coupled to an Ethernet interface (310). In the preferred embodiment, each of the individual circuits (301, 305, and 310) reside physically on separate circuit boards. In alternate embodiments, any circuits having substantially the same function can reside on one circuit board or even one integrated circuit. In other words, the present invention is not limited to three separate circuit boards.

The cable interface (301) is responsible for interfacing the CMTS to the home cable modem apparatus. The cable interface (301) also provides the functions of modulation and demodulation.

The cable interface circuit is comprised of a downstream packet flow path and an upstream packet flow path. The downstream packet flow path is comprised of a data throughput monitor (320) that is coupled to a flow limiter (315). The data throughput monitor (320) has an input that is coupled to the buffer circuit (305) from which the data packets flow and a feedback from the upstream path. The feedback from the upstream path is to allow a first CM to talk with other CMs. The data throughput monitor (320) has the task of determining the rate of data packet flow.

In the preferred embodiment of the CMTS, the downstream data packet flow rate is typically either 30 or 40 Mbps for each 6 MEZ channel, using QAM techniques. Alternate embodiments use other flow rates. The cable company decides which data packet flow rate should be used depending on the outcome desired by the company. The lower data rate is less susceptible to noise while the higher data rate can include more data per unit of time for the customers.

The data packet flow rate signal is fed into the flow limiter (315). This signal controls the flow limiter function. If the flow is greater than a predetermined level, $T_{max}$, the data packet flow can be limited. The flow limiter (315) reduces the data rate by dropping packets until the flow is reduced to below $T_{max}$.

Another input to the flow limiter (315) is the "limiting type" input. This control input is set by the cable company depending on how strict they wish a customer to adhere to the rules. If the "limiting type" input is set to "soft-limiting", the flow limiter (315) allows the data rate to go above the set data rate by a predetermined amount without dropping any packets.

Some cable companies may strictly limit a customer to $T_{max}$. In this case, the "limiting type" control input is set to "hard-limiting". If the data rate goes over the set hard limit, the flow limiter (315) drops any packets that force the customer to exceed $T_{max}$. The output of the flow limiter (315) is coupled to the cable that runs to the customers' cable modems.

The output of the flow limiter (315) is input to the modulator (355). This block (355) performs the QAM needed to transmit the data to the CMs.

The upstream data path is comprised of a demodulator and filter (360) that converts the QAM signal into data bits in order to be processed by the other blocks in the upstream path. The demodulated data bits are input to a data throughput monitor (325) that is coupled to the upstream port from the customer's CM. This data throughput monitor (325) has the same functionality as the downstream monitor (320) of monitoring the data rate but in the upstream direction to the Internet.

In the preferred embodiment, the upstream data rate can be in the range of 320 kbps to 10.24 Mbps. Alternate embodiment use other rates.

The upstream data throughput monitor (325) is coupled to a flow limiter (330). This flow limiter has similar functionality to the flow limiter (315) in the downstream path. The upstream path flow limiter (330) has the data rate input from the data throughput monitor (325) as well as the "limiting type" control input that, in the preferred embodiment, is set to either "hard-limiting" or "soft-limiting" depending on the cable company rules. As in the downstream flow limiter (315), the upstream flow limiter, depending on the "limiting type" input, drops all packets that force the customer to exceed $T_{max}$.

The upstream path further comprises a congestion control block (335) that is coupled to the upstream data path out of the flow limiter (330). The data packets from the upstream data path flow through the congestion control block (335) to the buffer circuit (305). The function of the congestion control block (335) is to drop packets when the buffer depth is reaching a maximum point. By dropping the packets before they reach the buffer, the buffer will not overflow.

In order to accomplish the task of congestion control, the congestion control block (335) has control inputs that are used to determine when to drop packets and which packets to drop. In the preferred embodiment, these control inputs include the data rate signal from the upstream data throughput monitor (325), a buffer depth signal from the buffer (305), and a priority signal.

The data rate signal from the upstream data throughput monitor (325), as described above, quantizes the data rate and feeds that value to the congestion control block (335). The buffer circuit depth signal from the buffer circuit (305) instructs the congestion control block (335) as to the depth of the buffer. In other words, if the buffer (305) is 75% full, the buffer depth signal instructs the congestion control block (335) of this.

The priority signal that is input to the congestion control block (335) informs the congestion control of the priority of each packet. This is important in determining which packets to drop.

A group of packets is assigned a priority based on the customer's level of service plan. If the customer has signed up for the basic service plan and paid the smallest fee for the most basic service, his packets are assigned a low priority. This priority is embedded in a packet identification that is assigned to the group of packets and is decoded when the group of packets enters the cable interface.

If the customer has signed up for the premium service plan with the cable company, his packets are assigned the highest priority. If the customer has signed up for any service plans that are in between the premium and the basic plans, this priority is also assigned to each packet. As described before, the priority is added to the packet identification for a particular group of packets.

A customer may also decide to dynamically change his service level for a given session. In this case, different packet groups from that particular customer will have different priorities assigned to different packet identifications.

As described subsequently in other figures, the congestion control block (335) of FIG. 3 uses the priority as sign ed to a group of packets to determine how to process that particular group of packets. The output of the congestion control block is input to the buffer circuit's upstream data flow input.

The buffer circuit (305) stores the packets until the Ethernet circuit (310) has time to process that packet. The packets are fed from the buffer circuit (305) to the Ethernet circuit (310) as more processing time is freed up.

The downstream path of the Ethernet circuit (310) is comprised of a data throughput monitor (350) that is coupled to the connection to the Internet. This monitor (350) provides substantially the same function as the previously described data throughput monitors on both the upstream and downstream paths.

The data packets from the Internet flow from the data throughput monitor (350) to the Ethenet's circuit flow limiter (345). This flow limiter (345) has substantially the same functionality as the above described flow limiters. This flow limiter also has the same inputs as described previously: the quantized data rate and the "limiting type" control input.

The data packets flow from the flow limiter (345) to the congestion control block (340). in the upstream congestion control block (335), the Ethernet's downstream congestion control block (340) has the three control inputs to determine which packets to drop: the quantized data rate, the buffer depth signal, and the packet priority signal. The congestion control block then drops a particular packet based on these control signals.

The downstream data flows from the congestion control block to the buffer circuit (305). The buffer circuit (305) stores the packets until the cable interface circuit has the processing time to work on additional packets.

The buffer circuit (305) is comprised of 128 MB of RAM, in the preferred embodiment. Alternate embodiments use other values of RAM or even other types of memory instead of RAM. The alternate types of memory include hard drives or other types of temporary memory.

Most of the functions illustrated in FIG. 3 may be implemented in various ways. These functions can be performed in software by a processor or multiple processors performing each function. Each function can also be implemented in discrete logic hardware, a digital signal processor, or some other form of programmable logic.

Figure 1:
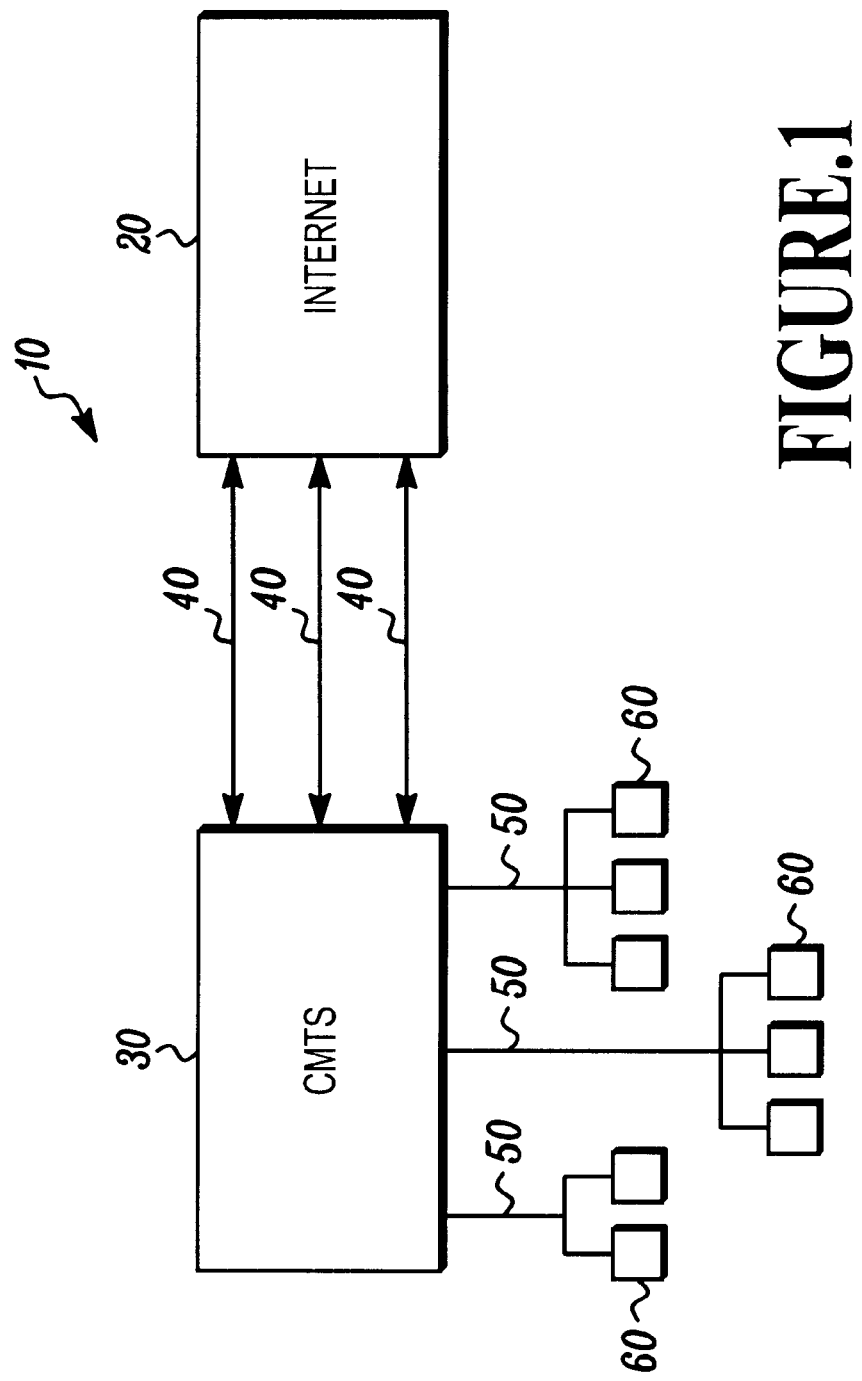
FIG. 1 illustrates an exemplary cable data system.
Figure 2:
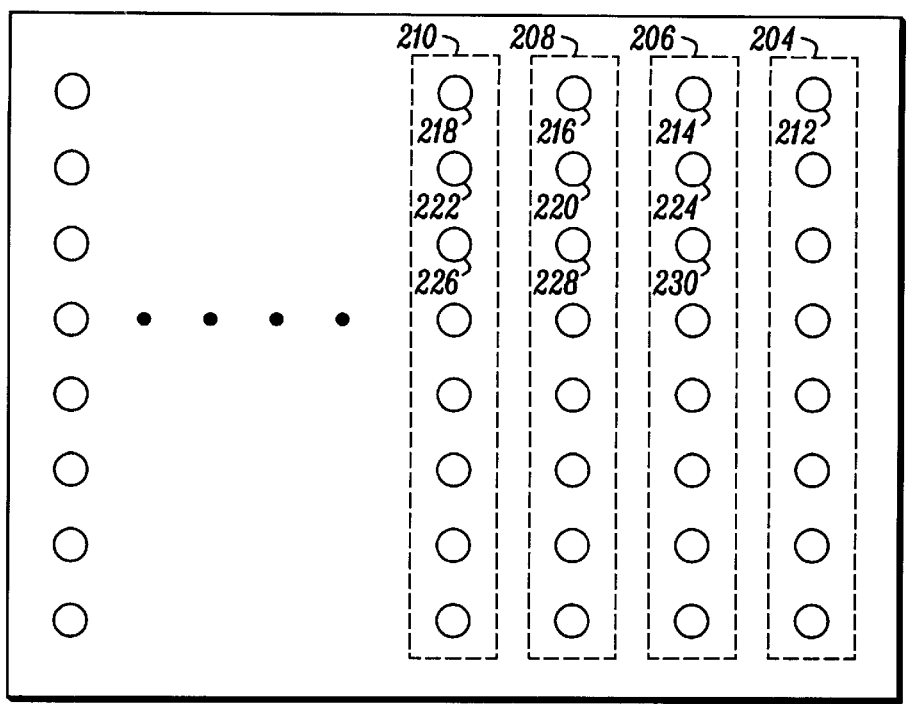
FIG. 2 illustrates a prior art connector pattern on the back side of a CMTS chassis.
Figure 4:
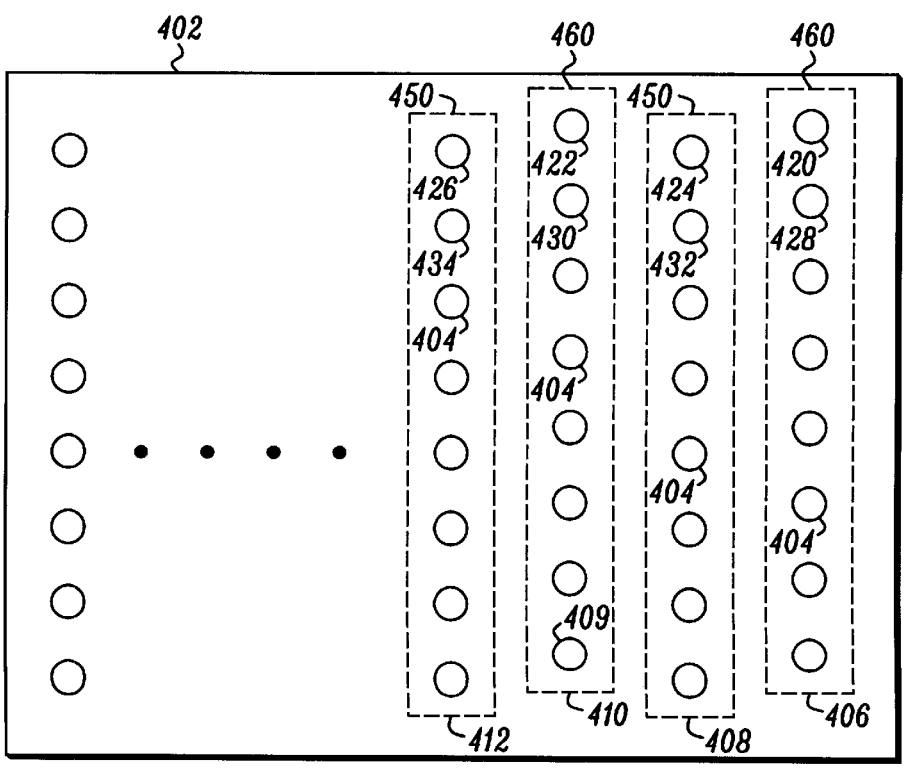
FIG. 4 illustrates a back plane of a CMTS according to one embodiment of the invention.

FIG. 4 shows an elevation view of several circuit card panels onto which coaxial cable connectors 404 have been affixed. The placement of coaxial cable connectors 404 on circuit card panels (The circuit card panels are shown as the broken-line rectangles surrounding the small-diameter circles that represent the coaxial connectors.) is such that the coaxial cable connectors on a first type of panel 450 are vertically displaced, vertically staggered or vertically offset from the connectors 404 on a second type of panel 460.

Figure 6:
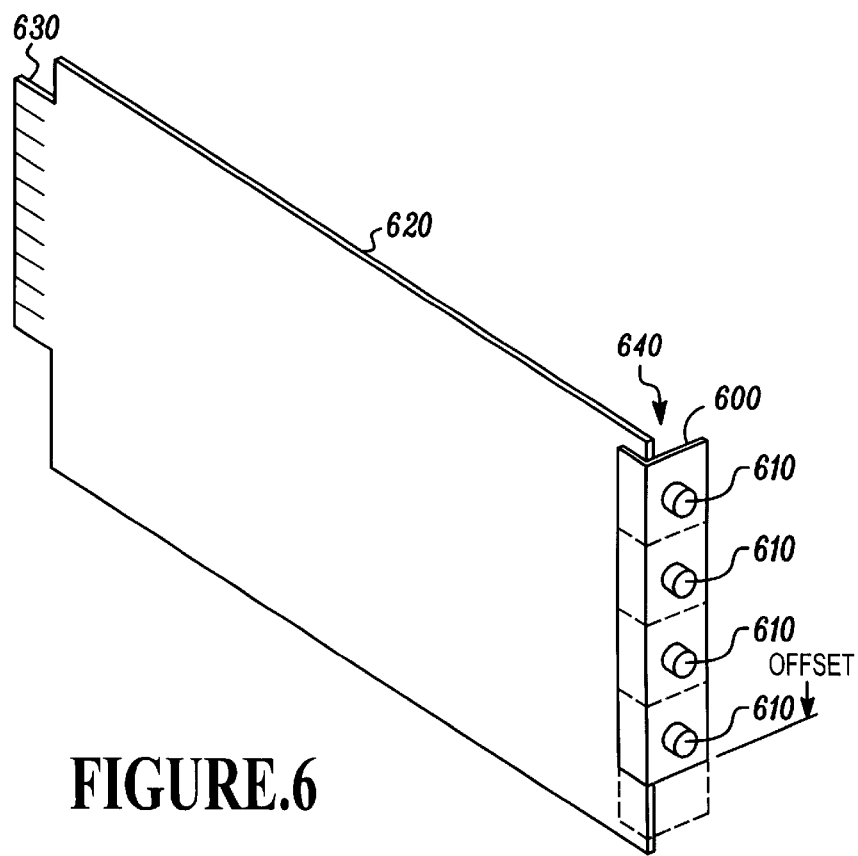
FIG. 6 shows a perspective view of an exemplary circuit card, including a front plate on which there are mounted a plurality of coaxial cable connectors.

FIG. 6 shows a perspective view of an exemplary circuit card 620. A front plate 600 is attached at one end 640 of the circuit card 620 and has attached to it several coaxial cable connetors 610. The coaxial cable connectors 610 are wired to electrical circuits and component s on the card 620 (not shown). A series of electrical contacts 630 comprise a so-called edge connection by which electrical connections are made to circuits on the card 620 when the card 620 is inserted into an edge connector. Instead of using one front plate 600 to mount several coaxial cable connectors 610, an equivalent (for claim construction purposes) would be the use of two or more separate plates (as shown by the broken lines in the single plate 600) by which the individual connectors 610 would be attached to the front edge 640 of the circuit board 620. For purposes of claim construction, the use of separate, individual mountings of coaxial cable connectors to the circuit board are considered to be equivalent to a single plate to which several connectors are attached.

With respect to FIG. 4, in the preferred embodiment, the staggered or offset displacement of coaxial cable connectors 404 on adjacent circuit cards (406 is adjacent to 408; 410 is adjacent to 412) is accomplished by using two different types of circuit card panels. The circuit card panels, which are depicted in FIG. 4 as the broken-line rectangles surrounding the small-diameter circles that represent the coaxial connectors, are attached to their corresponding circuit cards (circuit boards) offset from the circuit card bottom (or top) edges yielding two different types of circuit cards. In the preferred embodiment, circuit cards identified by reference numerals 406 and 410 are considered to be "odd" cards; circuit cards identified by reference numerals 408 and 412 are considered to be "even" cards. With respect to FIG. 6, "odd" and "even" cards can be made by mounting the front plate 600 at two different offset positions on the card 620 front edge 640. An alternative and equivalent way to made "odd" and "even" cards would be to mount the coaxial cable connectors 610 into the front plate 600 at two different offset positions, requiring the use of two "different" front plates 600. All of the various ways of changing the relative location of the coaxial cable connectors on the card edge are considered to be equivalent.

When an "odd" card is inserted into a particular card edge connector in the CMTS card cage, and when an "even" card is inserted into an adjacent back plane connector, the relative placement of the coaxial cable connectors on an "odd" card with respect to the same-function connectors on an "even" card is offset from the connectors on the even card.

In an alternate embodiment, displaced coaxial connectors on adjacent circuit cards can be achieved by using circuit card edge connectors.

Figure 5:
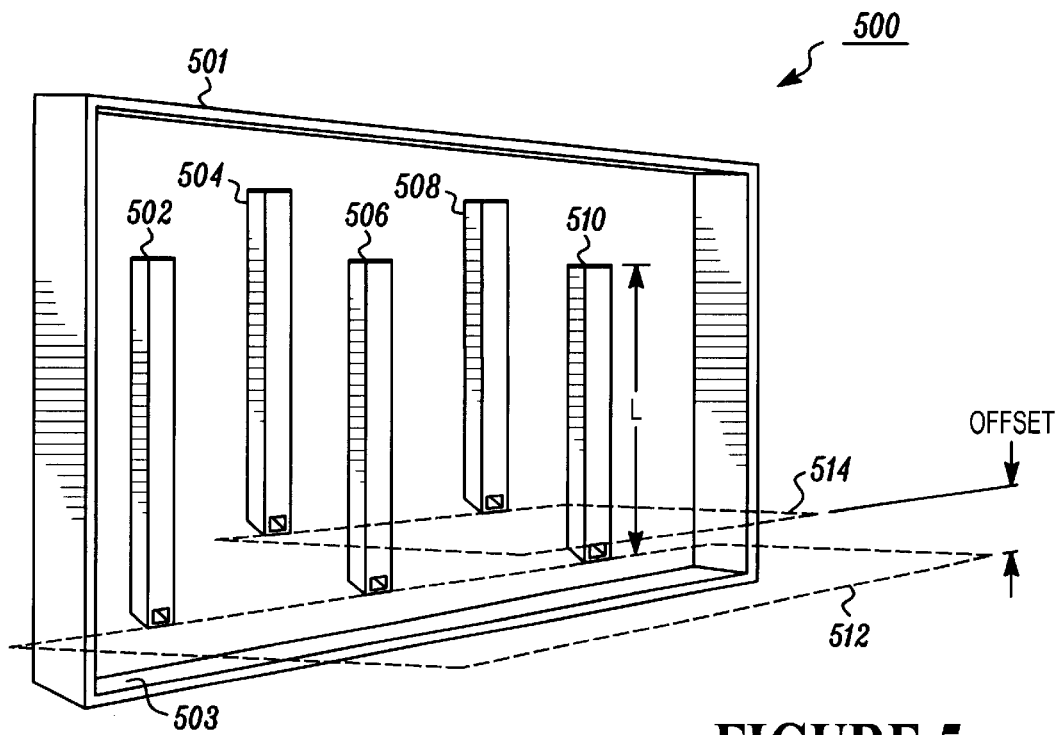
FIG. 5 shows a perspective view of a circuit card cage and card edge connectors that are mounted in the cage in two different horizontal planes.

FIG. 5 shows a simplified perspective view of a card cage 500 at one end of which are located several circuit card edge connectors 502, 504, 506, 508 and 510. In this alternate embodiment, a top 501 and bottom 503 side (or face) of the card cage lie in parallel planes. Each of the edge connectors are identical (accept the same size circuit card and the same number of edge connector pins) except that the connectors of one set of edge connectors 502, 506 and 510 are mounted to the card cage 500 translationally offset from the second set of edge connectors 504 and 506. The translational offset of the two sets of connectors with respect to each other can be considered to be vertical or horizontal, depending upon the orientation of the card cage 500. (By rotating the orientation of FIG. 5 ninety degrees, the connectors 502, 504, 506, 508 and 510 become horizontally displaced with respect to each other; coaxial cable connectors attached to the cards then become horizontally displaced as opposed to vertically displace.)

All of the edge connectors in FIG. 5 are mounted into the card cage 500 such that their longest dimensions (their length, L) are parallel to each other and orthogonal to a plane 512 to which the first set of edge connectors 502, 506 and 510 is tangent to. The second set of connectors 504 and 508 are parallel to the first set but translationally offset (staggered) in a direction orthogonal to the plane 512. The second set of connectors has one end tangent to a second plane 514 that is substantially parallel to the first plane 512.

When circuit cards are mounted into the connectors depicted in FIG. 5, the cards inserted into the first set of connectors will rest at a first elevation below that of the circuit cards inserted connectors of the second set. It can be seen that the ends of the connectors of one set of connectors is substantially tangent to the plane 512 while the ends of the connectors of the second set of connectors is substantially tangent to another plane 514 that is shown as parallel to plane 512 but vertically displaced. Stated alternatively, the connectors of both sets are identical except that every other connector is offset from it's neighbor. By staggering the connectors into which circuit cards are to be installed instead of using two different styles of cards as in the first embodiment, a single type of circuit card can be used but because the adjacent cards are inserted into staggered edge connectors. In the aforementioned alternate embodiment, an entire card is staggered as are any coaxial cable connectors on the front plates of the adjacent albeit different cards. Unlike the preferred embodiment wherein two different types of cards (different because of different card plates into which the coaxial cable connectors are mounted) must be used adjacent to each other, the alternate embodiment can use a single card type, which when inserted into staggered connectors produces an equivalently staggered connector arrangement.

According to one embodiment of the invention, the connectors on circuit cards in the back side of the CMTS chassis (The designation of a "back" side as opposed to a "front" side is subjective. For purposes of claim construction, "front" and "back" sides of a chassis are considered to be equivalent.) The coaxial connectors are staggered in such a manner so as to optimize the distance between adjacent connectors.

FIG. 4 illustrates a (back or front) side of a CMTS chassis 402 according to one embodiment of the invention. In this example, the connectors 404 are arranged on four cards 406, 408, 410 and 412 respectively. Cards 406 and 410 are even cards while cards 408 and 412 are odd cards. In prior systems such as the one illustrated in FIG. 3, the edge connectors for each of the cards are situated in the same horizontal plane . In other words, the first connectors on each of the cards are lined up in a straight line. By using two different types of connector plates however, wherein one the connectors are higher (or lower) than the connectors of the other plate, when the two different card types are inserted into the edge connectors the coaxial cable connectors are staggered in adjacent cards.

According to one embodiment of the invention, the locations of the connectors on the even cards are staggered from the positions of the connectors on the odd cards. As illustrated in FIG. 4, the first connectors 420 and 422 on even cards 406 and 410 respectively are positioned higher than the first connectors 424 and 426 of the odd cards 408 and 412. Furthermore, the first connectors 424 and 426 are positioned higher than the second connectors 428 and 430 on even cards 406 and 410. It will be understood that more than two different types of cards can be used so long as the resulting pattern of connectors are staggered with respect to adjacent connectors on adjacent cards.

According to one embodiment of the invention, the amount of stagger is determined using basic geometry. Optimum spacing is considered to be a vertical displacement (or horizontal displacement in instances where circuit cards are installed in vertically-offset horizontal planes) of adjacent connectors on adjacent cards by which the spacing or separation of connectors is maximized. (In the preferred embodiment a positioning of coaxial connectors on an adjacent circuit card front plate.) By way of example, if the vertical distance between coaxial cable connectors of one card front plate is equal to 1 inch, and if the horizontal distance between a vertical line extending through the center conductors on adjacent circuit cards, (both of which presumably have coaxial cable connectors equally spaced apart) is also one inch, an optimum offset of the connectors between adjacent cards (i.e. the vertical displacement of adjacent connectors) is approximately ½ inch such that the distance between staggered connectors would be calculated to be $=((1)^2+(½)^2)^{1/2}\sqrt{}=1.25$. In the preferred embodiment, the stagger between connectors of the odd cards and even cards is such that the connectors on the odd cards are staggered so that the connectors are approximately equidistant from connectors on adjacent cards, and vice versa. For example, connector 424 is situated so as to be equidistant from connectors 420, 422, 428 and 430. This stagger pattern provides more room between connectors and thus helps to alleviate some of the connection/disconnection problems associated with high density cabling. To maximize the advantage of these staggering patterns, the cards need to be alternated between odd and even when installed but the invention is not limited thereto. In the alternate embodiment, i.e. wherein the circuit card edge connectors are staggered in the card cage, it is not necessary to install different types of circuit cards (i.e. "odd" or "even" cards) in adjacent card slots.

While exemplary systems and method embodying the present invention are shown by way of example, it will be understood, of course, that the invention is not limited to these embodiments. Modifications may be made by those skilled in the art, particularly in light of the foregoing teachings. For example, each of the elements of the aforementioned embodiments may be utilized alone or in combination with elements of the other embodiments.

We claim:

1. A cable modem termination system (CMTS) having front and rear sides comprising:

a rear panel having a plurality of circuit card edge connectors, each of said circuit card edge connectors capable of receiving an edge connector for a circuit card;

a first circuit card having a front plate having a first set of coaxial cable connectors thereon, said front plate of said first circuit card mounted at a first position on said first circuit card;

a second circuit card having a front plate having a second set of coaxial cable connectors thereon, said front plate of said second circuit card mounted at a second position on said second circuit card;

whereby when said first circuit card is inserted into a first circuit card edge connector in said rear panel and when said second circuit card is inserted into an adjacent, second circuit card edge connector in said rear panel, coaxial connectors of said first set of coaxial connectors on the front plate on said first circuit card are offset with respect to coaxial cable connectors of said second set of coaxial connectors on the front plate on said second circuit card.

2. The apparatus according to claim 1, wherein said connectors are staggered so as to optimize the separation between connectors on adjacent cards.

3. The apparatus according to claim 1, wherein first and second circuit card types are alternately inserted into adjacent connectors in said rear panel.

4. The apparatus according to claim 3, wherein a coaxial cable connector on both said first and second circuit card types are approximately equidistant from all other connectors on adjacent connector cards when said first and second circuit card types are alternately inserted into adjacent connectors.

5. A cable modem termination system (CMTS) card cage having at least first and second sides and a bottom comprising:

a first circuit card edge connector coupled to a first side of said card cage, the greatest dimension of said first circuit card edge connector being substantially orthogonal to a first plane that is substantially parallel to said bottom, a first end of said first circuit card edge connector being substantially tangent to said first plane;

a second circuit card edge connector, coupled to said card cage and located adjacent to first circuit card edge connector, the greatest dimension of said second circuit card connector being substantially orthogonal to said first plane, a first end of said second circuit card edge connector being substantially tangent to a second plane, said second plane being substantially parallel to said first plane and orthogonally displaced from said first plane by a predetermined distance substantially less than the greatest dimension of said first and second circuit cards, such that coaxial cable connectors of a first circuit card having a plurality of said coaxial cable connectors thereon, when inserted into said first circuit card edge connector will be staggered with respect to coaxial cable connectors of a second card also having a plurality of coaxial cable connectors thereon, when said second card is inserted into said second circuit card edge connector.

6. A cable modem termination system (CMTS) having front and rear sides, and a bottom comprising:

a rear panel having a plurality of circuit card edge connectors, said circuit card edge connectors being alternately mounted to at least one of said front and rear sides at first and second elevations with respect to said bottom of said CMTS;

a first circuit card coupled to a first circuit card edge connector, said first card having a first set of coaxial cable connectors thereon;

a second circuit card coupled to a second circuit card edge connector, said second card having a second set of coaxial cable connectors thereon, said first and second set of coaxial cable connectors on said first and second circuit cards respectively being offset from each other with respect to said bottom when inserted into said first and second circuit card edge connectors.

7. A cable modem termination system (CMTS) having front and rear sides, and a bottom comprising:

a cable modem termination system panel having a first circuit card edge connector at a first elevation from said bottom and a second circuit card edge connector at a second elevation from said bottom;

a first circuit card having a set of coaxial cable connectors thereon said first circuit card coupled into said first circuit card edge connector;

a second circuit card having a set of coaxial cable connectors thereon, said second circuit card coupled into said second circuit card edge connector such that coaxial cable connectors on said first and second circuit cards are offset with respect to each other and with respect to said bottom.

* * * * *